(12) United States Patent
Humbert et al.

(10) Patent No.: US 12,255,601 B2
(45) Date of Patent: Mar. 18, 2025

(54) FILTER FOR AN ELECTRIC MACHINE (71) Applicant: Schaeffler Technologies AG & Co. KG, Herzogenaurach (DE)

(72) Inventors: Andreas Humbert, Ottersweier (DE); Bao Ngoc An, Karlsruhe (DE)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 336 days.

(21) Appl. No.: 17/783,366

(22) PCT Filed: Nov. 30, 2020

(86) PCT No.: PCT/DE2020/101008
§ 371 (c)(1),
(2) Date: Jun. 8, 2022

(87) PCT Pub. No.: WO2021/121469
PCT Pub. Date: Jun. 24, 2021

(65) Prior Publication Data
US 2023/0011426 A1 Jan. 12, 2023

(30) Foreign Application Priority Data
Dec. 17, 2019 (DE) .................. 10 2019 134 671.1

(51) Int. Cl.
*H02K 3/12* (2006.01)
*H02K 3/47* (2006.01)
*H02K 11/02* (2016.01)
*H02M 1/12* (2006.01)
*H03H 7/01* (2006.01)

(52) U.S. Cl.
CPC .......... *H03H 7/0115* (2013.01); *H02K 11/02* (2013.01); *H02K 3/12* (2013.01); *H02K 3/47* (2013.01); *H02M 1/126* (2013.01)

(58) Field of Classification Search
CPC ............ H02K 3/12; H02K 3/47; H02M 1/126
See application file for complete search history.

(56) References Cited

U.S. PATENT DOCUMENTS

| 4,926,111 A * | 5/1990 | Lungu ................. H01G 4/40 336/69 |
| 6,985,064 B1 * | 1/2006 | Loukas ............... H01F 27/2847 336/234 |
| 8,373,530 B2 * | 2/2013 | MacLennan .......... H01F 27/324 336/90 |
| 2018/0068779 A1 * | 3/2018 | Wennerstrom ...... H01F 27/2823 |

FOREIGN PATENT DOCUMENTS

| DE | 19628897 C2 | 12/1999 |
| DE | 19842523 A1 | 3/2000 |
| DE | 102013114352 A1 | 6/2014 |
| DE | 102014009175 B4 | 2/2017 |
| JP | H04304706 A | 10/1992 |
| SK | 102012 A3 | 9/2013 |
| SK | 288779 B6 | 10/2020 |

* cited by examiner

*Primary Examiner* — Gary A Nash (57) ABSTRACT

A filter for an electric machine is disclosed. The filter has an inductor, which is a coil, and a capacitor. The coil has multiple windings, and each turn of the windings includes at least one conductor which is designed to be flat. By virtue of the flat conductor of the coil, the capacitance of the filter is thus formed in the coil itself In the process, the surface of one conductor is arranged opposite the surface of an adjacent conductor.

9 Claims, 9 Drawing Sheets

Prior Art

FILTER FOR AN ELECTRIC MACHINE

CROSS-REFERENCE TO RELATED APPLICATIONS

This application is the U.S. National Phase of PCT Appln. No. PCT/DE2020/101008 filed Nov. 30, 2020, which claims priority to DE 102019134671.1 filed Dec. 17, 2019, the entire disclosures of which are incorporated by reference herein.

TECHNICAL FIELD

The disclosure relates to a filter for an electric machine.

BACKGROUND

The power electronics, which is required for the operation or control of an electric machine, produce switching losses, which consequently generate heat. In order to be able to reduce these switching losses and enable higher voltages, the trend in electric machines according to the prior art is towards the use of silicon carbide components (SiC).

Due to the low switching losses with steep switching flanks, reflections occur in the cable between the machine and the power electronics, so that voltage overshoots occur on the windings of the electric machine, which have a negative effect on the insulation of the winding and reduce the service life of the machine. Furthermore, controlling the motor with direct pulse width modulation (PWM) is not optimal due to efficiency deficits.

SUMMARY

To reduce the life cycle risks of the motor, the power electronics can be supplemented with a filter stage. This supplement provides at least one inductor and one capacitor, which, as separate components, require additional installation space and generate corresponding costs. In addition, there are losses in the filter stage, so that this heat has to be dissipated in the filter. For example, if a sine filter is used, the harmonic component in the output voltage of the inverter can be minimized and the output voltage can be converted into an almost sinusoidal signal, so that losses in the machine can be reduced.

The object of the disclosure is therefore to create a filter for an electric machine that comprises the necessary inductors and capacitors and in doing so optimizes the costs, the cooling, the installation space, and the service life of the insulation of an electric machine.

This object is achieved by a filter for an electric machine according to the features described herein.

The filter according to the disclosure for an electric machine comprises an inductor, which is a coil, and a capacitor. The coil has multiple windings, wherein each turn of the windings of the coil comprises at least one conductor, which is designed to be flat. In this case, the coil itself forms the capacitor of the filter, wherein one surface of a conductor is arranged opposite the surface of an adjacent conductor for this purpose. The conductor can be constructed, for example, as a copper sheet or as a wire with a rectangular cross-section. The individual conductors are electrically insulated from one another by insulation material. Insulation films, varnish layers, ceramics, etc., can be used as insulation material. It is also conceivable that turns of the windings are composed of multiple individual pieces of the conductor. The conductor differs in geometry (cross-section) by its ratio between the width and height. The sufficiently high capacitors for the filter are generated by parallel and opposite surfaces of the conductors.

The advantage of the disclosure is that by integrating the filter elements (at least the filter and coil) in or on the electric machine, the system made up of the electric machine and filter elements is more compact and cost-effective than the prior art solutions.

According to a possible embodiment of the disclosure, the coil comprises a first winding and a second winding. The turn of the first winding and of the second winding consists of a single conductor.

In the event that the coil with the first winding and the second winding is wound around the core and a defined axis of rotation, both windings are insulated from one another by an insulating layer or insulation material. Both windings are energized 180° out-of-phase to compensate for the magnetic flux in the iron core and to avoid saturation effects in the core material. As a result, a compact core material can be used.

In addition to a rotationally symmetrical geometry, the filter can have any configuration. The number of windings can also be varied and can also be multi-layered.

According to a further possible embodiment of the disclosure, the turn of the first winding and of the second winding can comprise multiple separate conductors. The multiple separate conductors together form the surface in each turn which, together with other areas of the turns of the first winding and of the second winding, forms the capacitor required for the filter.

In addition to the embodiment with two windings, multiple windings can also be used. Half of the windings are then connected in parallel or in series. This can reduce effects such as proximity and skin effects. To further increase the capacity, these windings can also be arranged in multiple layers and staggered.

According to a further possible embodiment of the disclosure, the coil can consist of a first winding, a second winding, a third winding and a fourth winding. Each winding comprises multiple separate conductors, which together in each turn form the surface, which ultimately forms the capacitor of the filter.

The turns of all the windings for the coil of the filter are wound around a core. The conductor of each winding is insulated from the other conductors by an insulation material which electrically insulates the conductors from one another.

A filter system according to the disclosure comprises at least one filter, which can be constructed as described above according to the various embodiments. The filter is attached to a stator ring in such a way that the filter is connected to the stator ring via the core. According to one possible embodiment, the filter can be oriented toward an interior of the stator ring. According to another embodiment, the filter can be inserted into the stator ring and aligned in the direction of an axis of the stator ring.

If, for example, at least three filters are provided on the stator ring, this is referred to as a three-phase implementation variant. The stator of an electric machine can be made up of a laminated stack of multiple stator rings. The stator ring with the filters can be applied directly to the geometry of the stator of the electric machine. The magnetic circuit is shown open to ensure the necessary leakage flux.

Accordingly, the geometry can also be implemented in multiple phases or with a closed magnetic circuit. Depending on the geometry of the electric machine and the application, multiples of these filter elements can also be connected in parallel to form one phase. Due to the direct connection of the filter element to the iron of the stator of the electric machine, the filter elements are cooled directly by the existing cooling of the electric machine.

The interior is ideal for integrating the power electronics due to the existing ends of the windings. This creates a compact ring that can be attached directly to the motor.

According to a further embodiment, power electronics can be installed in an interior defined by the stator ring. The stator ring can be mounted on the stator of the electric machine together with the at least one filter. The stator ring can also be mounted on the stator of the electric machine together with the filter and the built-in power electronics.

According to another possible embodiment, the coil can consist of conductors that are flat and wide. These conductors are positioned in multiple layers on a front side of a stator of the electric machine. According to another embodiment, the flat and wide conductors can be wound in multiple layers on a lateral surface of the stator of the electric machine. According to these embodiments, the at least one filter and the stator of the electric machine represent the filter element.

For a multi-phase electric machine, the coils made of the flat and wide conductors must be placed on top of each other multiple times. These two implementation options make it possible to implement a large-area and compact coil element with a comparatively large capacitor. Another advantage is that the coils or filters are thermally very well connected to the electric machine.

The flat and wide conductors are preferably made of copper.

BRIEF DESCRIPTION OF THE DRAWINGS

With reference to the accompanying drawings, the disclosure and its advantages will now be explained in more detail by means of exemplary embodiments, without thereby limiting the disclosure to the exemplary embodiment shown. The proportions in the figures do not always correspond to the real proportions, since some shapes are simplified and other shapes are shown enlarged in relation to other elements for better illustration.

DETAILED DESCRIPTION

Identical reference symbols are used for elements of the disclosure that are the same or have the same effect. Furthermore, for the sake of clarity, only those reference symbols that are necessary for the description of the respective figure are shown in the individual figures. The figures merely represent exemplary embodiments of the disclosure without, however, restricting the disclosure to the exemplary embodiments shown. The figures shown do not claim the completeness of the structure of an electric machine (electric motor).

Figure 1:
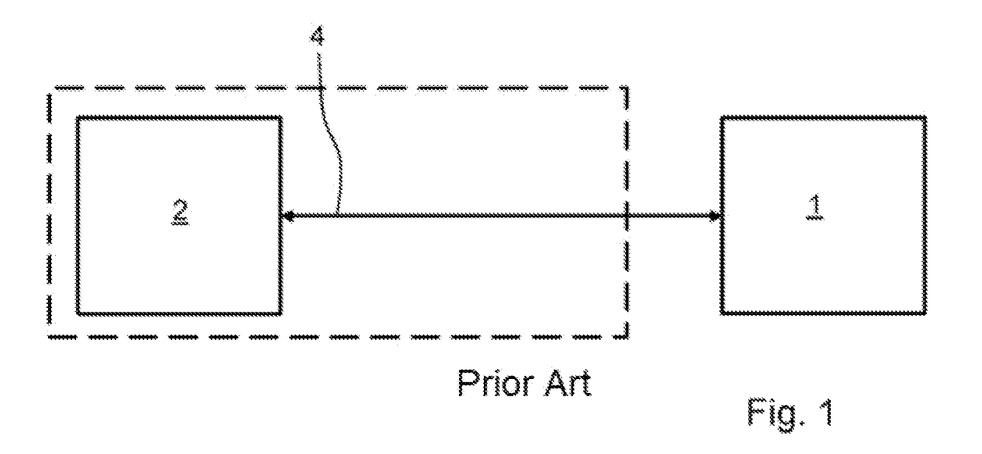
FIG. 1 shows a schematic arrangement from the prior art of the power electronics, filter and electric machine.

FIG. 1 shows a schematic arrangement from the prior art of the power electronics 2 and electric machine 1. The power electronics 2 is connected to the electric machine 1 via a cable 4. A filter (not shown here) can be interposed between the electric machine 1 and the power electronics 2. The filter 3 (see FIG. 2) includes at least one inductor 5 and one capacitor 6, which, as separate components, require additional installation space and generate corresponding costs.

Figure 2:
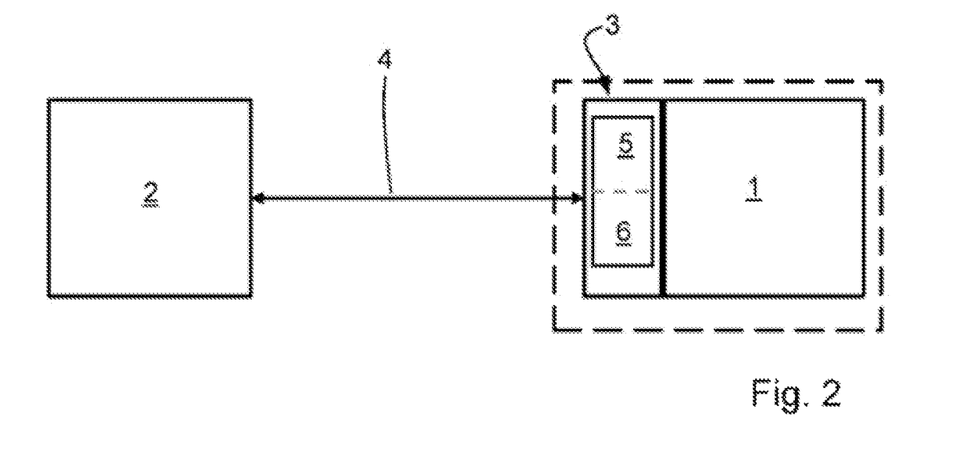
FIG. 2 schematically shows an exemplary embodiment according to the disclosure of the arrangement of the power electronics, filter and electric machine.

FIG. 2 shows a schematic arrangement of a possible embodiment of the arrangement of the power electronics 2, filter 3 and electric machine 1 according to the disclosure. The power electronics 2 is connected to the electric machine 1 via a cable 4. According to the disclosure, the filter 3 is assigned to the electric machine 1. The filter 3 is designed in such a way that it forms an inductor 5 and a capacitor 6. The arrangement according to the disclosure of the filter 3 according to the disclosure on the electric machine 1 has the advantage that no additional installation space is required.

Figure 3:
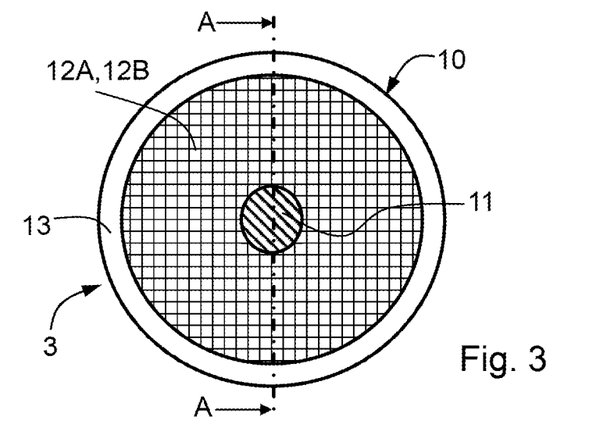
FIG. 3 shows a cross-section of a coil (inductor) used in the filter according to the disclosure.

FIG. 3 shows a cross-section through a coil 10 (inductor) as is used in the filter 3 according to the disclosure. The coil 10 has a core 11 around which a first winding $12_1$ and a second winding $12_2$ (see FIG. 4) are wound.

Figure 4:
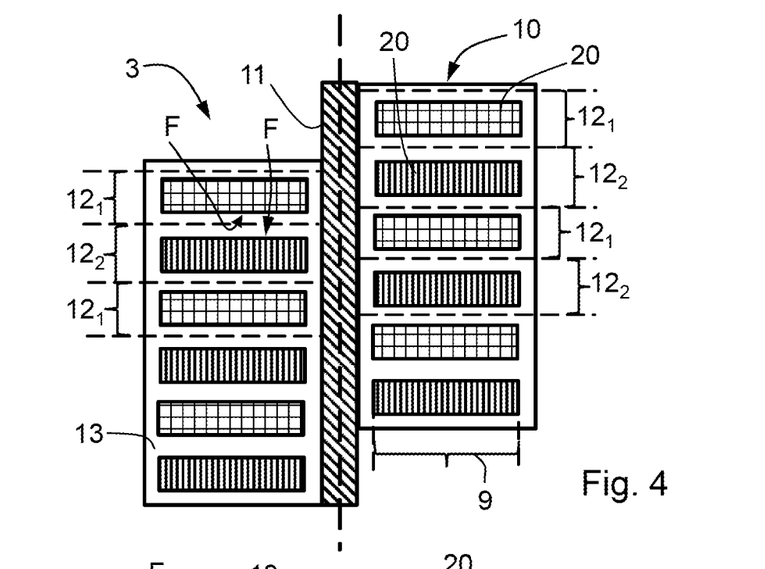
FIG. 4 shows a sectional view of the coil along the section line A-A shown in FIG. 3.

As can be seen in the embodiment shown in FIG. 4 (sectional view of the coil 10 along the section line A-A shown in FIG. 3), the coil 10 is made up of a first winding $12_1$ and a second winding $12_2$, which alternate along the core 11. An insulating layer 13 surrounds the conductor 20 of the turns 9 of the first winding $12_1$ and of the second winding $12_2$ and thus insulates them from one another. In this embodiment, the insulation material 13 is a layer of lacquer which surrounds the conductor 20. Both windings $12_1$ and $12_2$ are energized 180° out-of-phase in order to compensate for the magnetic flux in the core 11 (iron core) and to avoid saturation effects in the material of the core 11. This means that a compact material can be used in the core 11.

Figure 5:
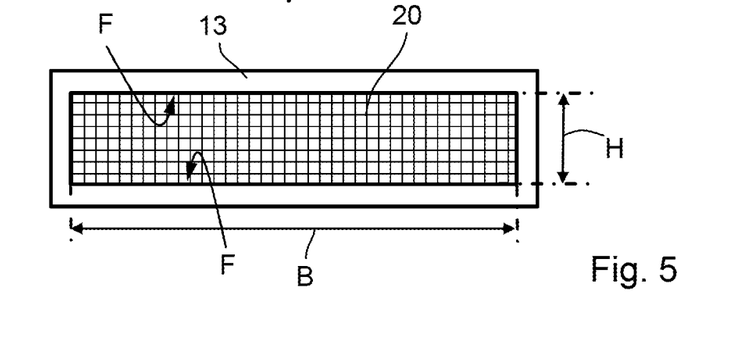
FIG. 5 schematically shows the cross-section of a conductor with which the coil of the filter is wound.

FIG. 5 schematically shows the cross-section of a conductor 20 with which the coil 10 of the filter 3 is wound. In this embodiment, the conductor 20 is constructed analogously to the enameled wire of an electric machine and is surrounded by an insulation material 13, which is, for example, a layer of enamel. It is also conceivable that the insulation material 13 is not necessarily closed around the conductor 20. The representation of the conductor 20 with the insulating layer shown in FIG. 5 should not be construed as a limitation of the disclosure. The conductor 20 for the filter 3 is designed to be flat. This means that the conductor 20 has a width B to height H ratio such that the width B is greater than the height H of the conductor 20. The ratio between the width B and the height H results in opposite, parallel surfaces F, which extend along the length (not shown) of the conductor 20. As shown in FIG. 4, in the wound coil 10—the surfaces F of two successive conductors 20 in the coil 10—are opposite each other. As a result, a capacitor forms within the coil 10. The inductor 5 and capacitor 6 are thus combined in the coil 10.

Figure 6:
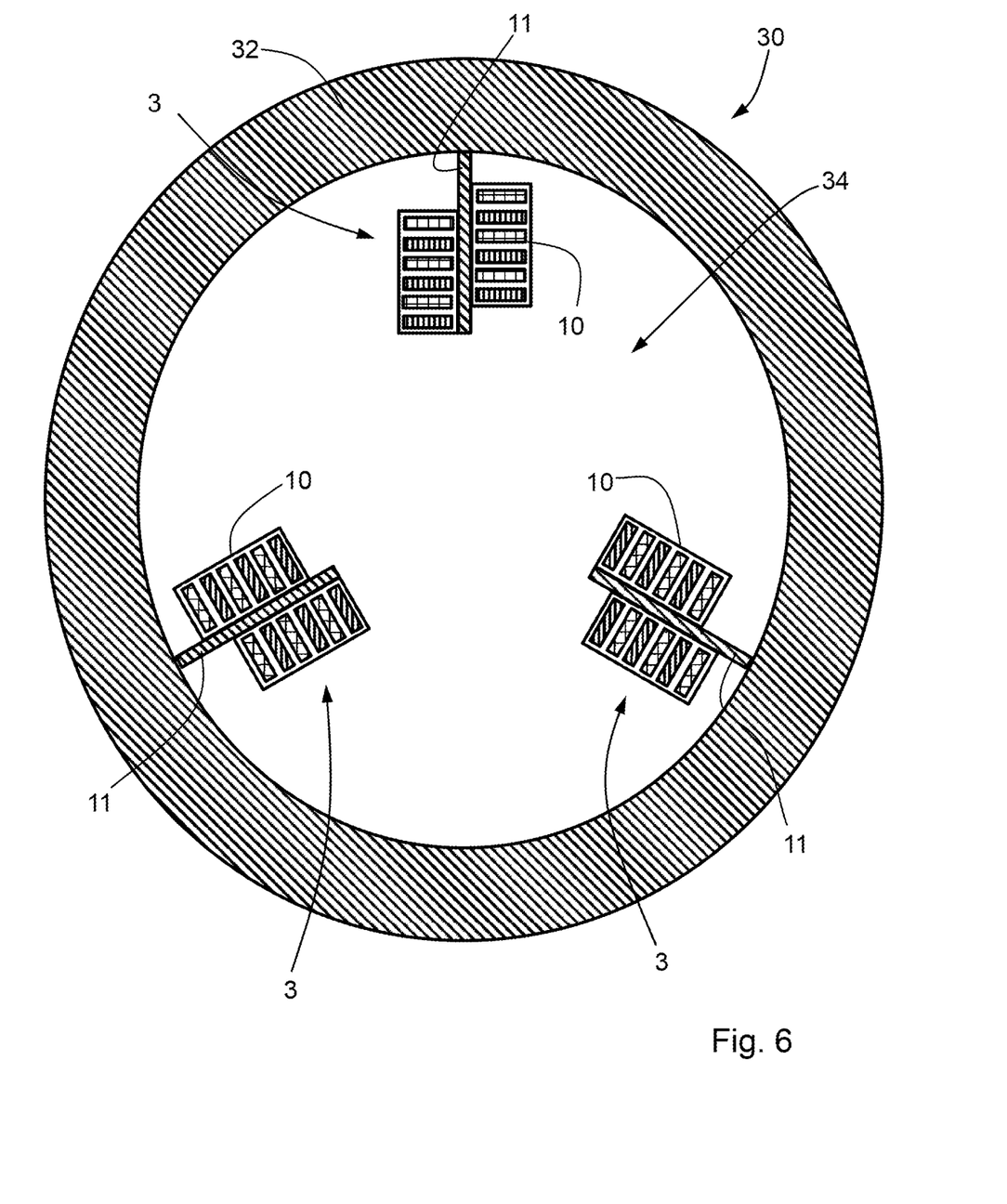
FIG. 6 shows a three-phase implementation variant of the filter according to the disclosure, which is attached directly to the stator of the electric machine.

FIG. 6 shows a three-phase implementation variant of the filter 3 according to the disclosure, which is attached directly to the stator (not shown) of the electric machine 1. The representation of FIG. 6 is a side view of the structure consisting of electric machine 1 (not shown) and stator ring 32.

In addition to the rotationally symmetrical geometry shown, the filter 3 can have any configuration. The number of windings can also vary and can also be multi-layered (see FIGS. 13-15). The structure of the filter 3 already described in FIG. 5 results in advantages with regard to integration into the electric machine 1 (not shown). Similar to the electric machine 1 (not shown), a multi-phase filter element 30 can be constructed similarly to the stator 102 (see FIG. 9 or 11) of the electric machine 1 (not shown).

The filter element 30 has three phases in the embodiment shown here.

Consequently, three filters 3 are attached to a stator ring 32, which forms an interior 34 in such a way that the filters 3 protrude into the interior 34. Each filter 3 is thus connected to the stator ring 32 via the core 11 of the coil 10. The stator ring 32 is applied directly to the geometry of the stator (not shown) of the electric machine 1. The stator ring 32 is shown in FIG. 6 as an open magnetic circuit to ensure the necessary leakage flux. The stator ring 32 can also be implemented with multiple phases or with a closed magnetic circuit. Depending on the geometry of the electric machine 1 and depending on the application, multiples of these filter elements 30 can also be connected in parallel to form one phase. Due to the direct connection to the iron of the stator, the filter elements 30 are cooled directly by the existing cooling (not shown) of the electric machine 1.

Figure 7:
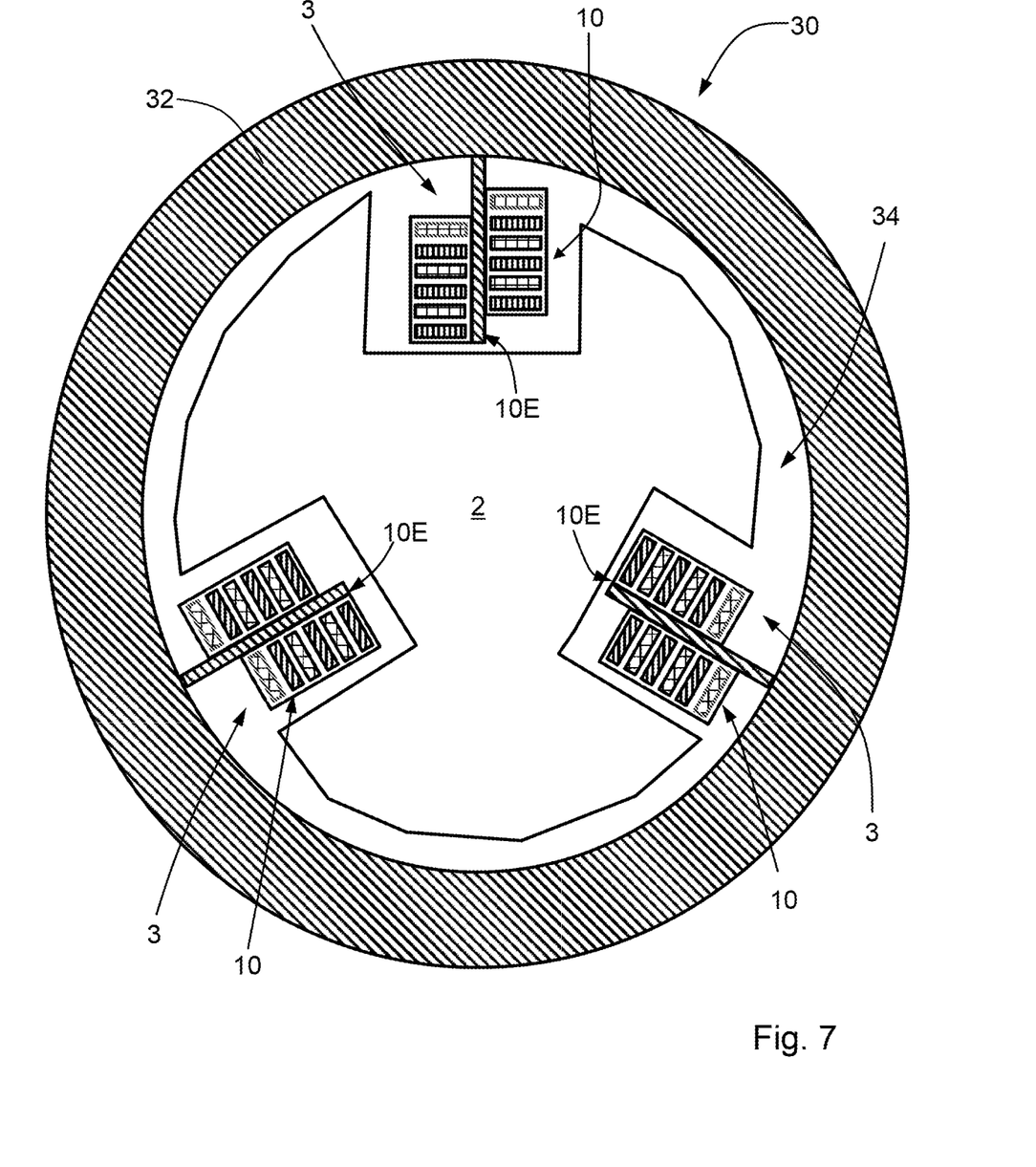
FIG. 7 shows another possible embodiment variant of the filter element.

FIG. 7 shows another possible embodiment of the filter element 30. Here, the interior 34 provided in the design of the filter element 30 is provided with the power electronics 2. The interior 34 is ideal for installing the power electronics 2 since the ends 10E of the coil 10 that are already present point to the interior 34. The ends 10E of the coil 10 can thus be easily connected to the power electronics 2. Installing the power electronics 2 in the interior 34 results in a compact ring which can also be attached directly to the stator of the electric machine 1. An integration of the power electronics 2 only makes sense if the magnetic circuits are closed in order to avoid the EMC problem.

Figure 8:
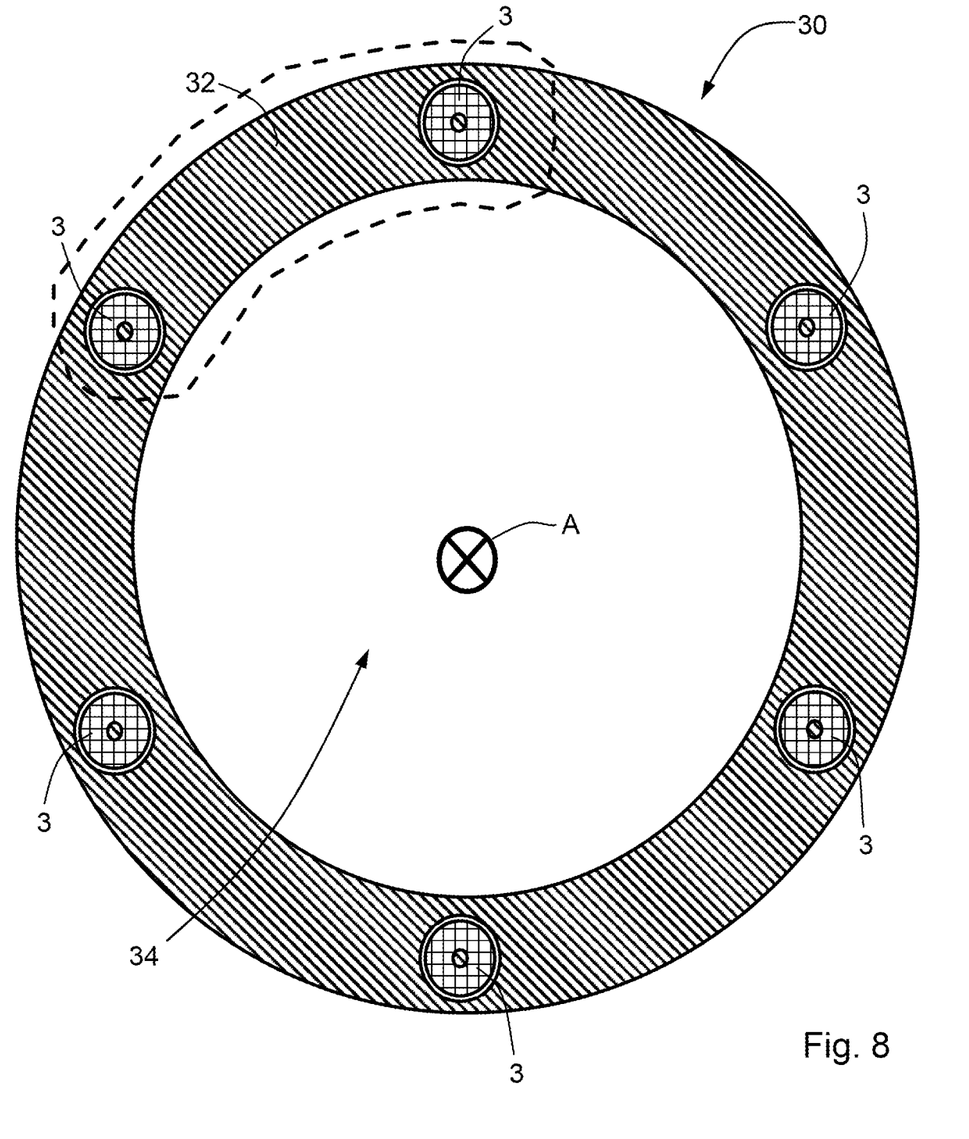
FIG. 8 additionally shows a possible variant of the filter element for an electric machine.

FIG. 8 shows an additional possible variant of the filter element 30 for an electric machine 1. Due to the geometry of the conductor 20 shown in FIG. 5, a filter 3 that is short in the direction of the axis A of the stator ring 32 or of the electric machine 1 can be implemented by the flat winding of the conductor 20. The length of the filter 3 corresponds approximately to the thickness of the stator ring 32 and can therefore also be arranged to be parallel to the axis A, i.e., perpendicular to the iron of the stator 102 of the electric machine 1. In this case, FIG. 8 shows a possible geometry for a three-phase radial flux machine with two parallel filters 3 each (indicated by a dashed line). The interior 34 in turn offers the installation space for the power electronics (not shown here). Due to the direct connection of the filter element 30 to the stator of the electric machine 1, busbars that connect the electric machine 1 to the power electronics 2 can be replaced.

In addition to the implementation described in FIG. 8 for a radial flux machine, this disclosure can also be used for any variants, such as axial flux transverse flux machines or combinations with any interconnections, such as star/delta. In addition to the application for the integration of filter elements 30, the described embodiments are also conceivable for the integration of the inductors of a DC/DC converter.

Figure 9:
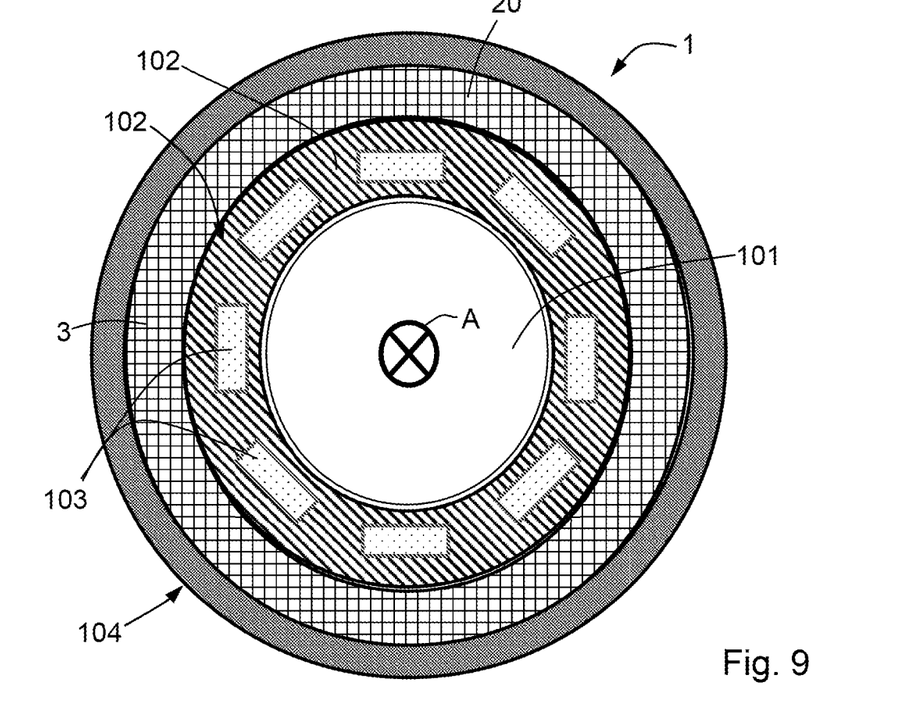
FIG. 9 shows a plan view in the axial direction of a possible embodiment for the winding of the coil of the filter of the filter element.

FIG. 9 shows a possible embodiment for the winding of the coil 10 of the filter 3 of the filter element 20 for the electric machine 1. The electric machine 1 comprises a rotor 101 and a stator 102. The winding heads 103 are formed in the stator 102. Flat and wide conductors 20, preferably made of copper, are used for winding the coil 10 of the filter 3 of the embodiments in FIGS. 9 and 11. In the embodiment shown in FIG. 9, these are attached directly to an end face 104 of the stator 102 and are wound around the stator 102. For a multi-phase electric machine 1, these filters 3 must be placed on top of one another several times.

Figure 10:
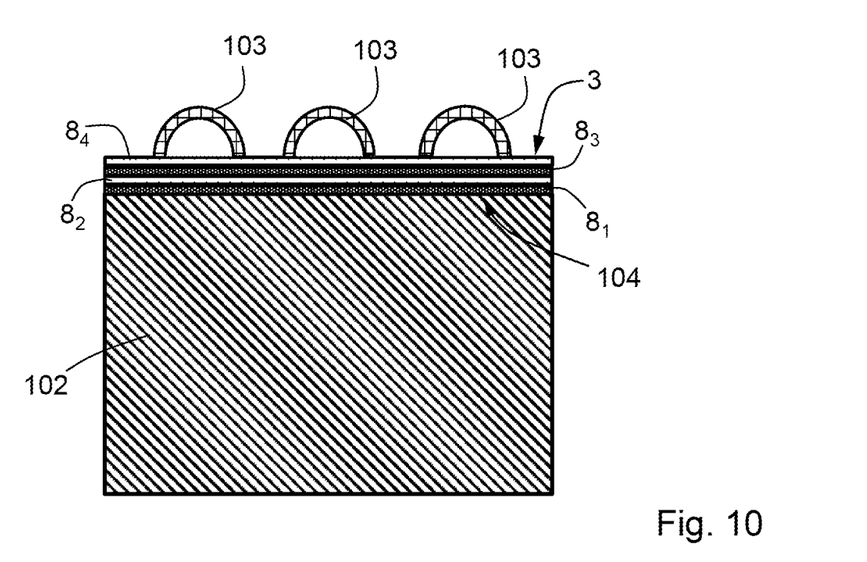
FIG. 10 shows a side view of the embodiment shown in FIG. 9 in partial section.

FIG. 10 shows a side view of the embodiment shown in FIG. 9 in partial section. It can be seen that multiple layers $8_1, 8_2, \ldots, 8_N$ of conductors 20 are placed on top of one other on the stator 102. These two implementation options make it possible to implement a large surface and compact coil element with a comparatively larger capacity.

Figure 11:
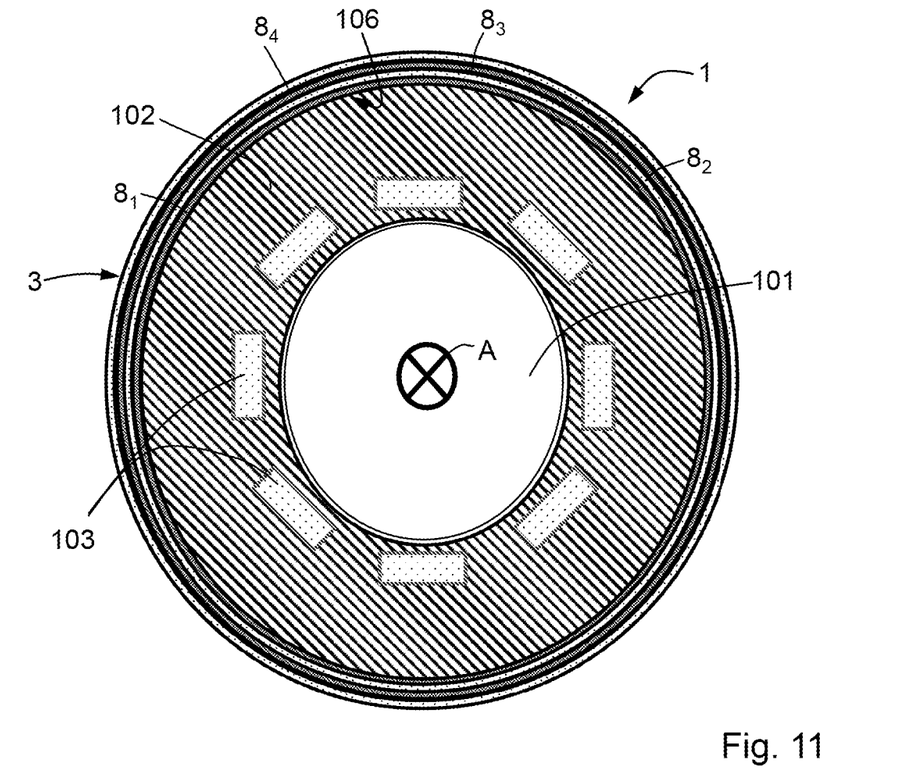
FIG. 11 shows the plan view in the axial direction of a further possible embodiment for the winding of the coil of the filter of the filter element.

FIG. 11 shows a plan view in the axial direction of a further possible embodiment for the winding of the coil 10 of the filter 3 of the filter element 20.

Figure 12:
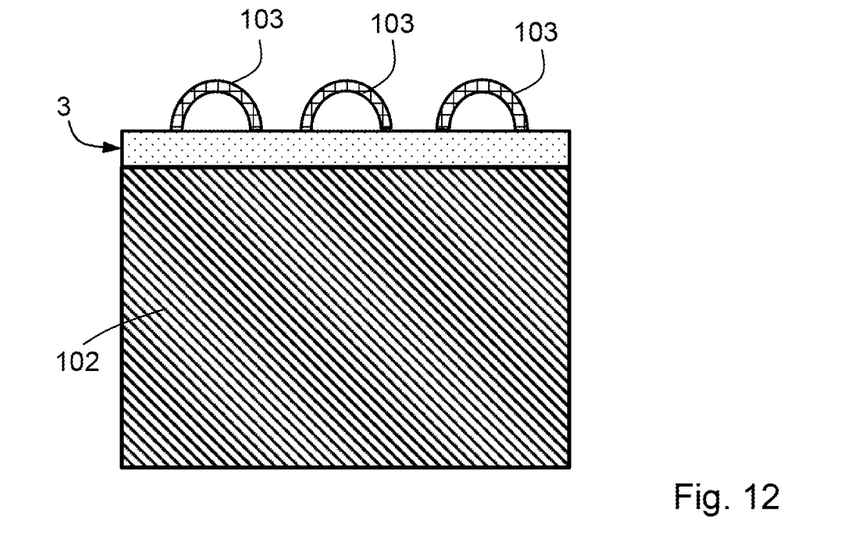
FIG. 12 shows a side view of the embodiment shown in FIG. 11 in partial section.

FIG. 12 shows a side view of the embodiment shown in FIG. 11 in partial section. As already mentioned in the description of FIG. 9, flat and wide conductors 20 (conductive strips which can also consist of multiple sections), preferably made of copper, are used for winding the coil 10 of the filter 3. In the embodiment shown in FIG. 11, these are wound around the lateral surface 106 of the stator 102 of the electric machine 1 in multiple layers $8_1, 8_2, \ldots 8_N$. For a multi-phase electric machine 1, these filters 3 must also be placed on top of one another multiple times. FIG. 11 shows a side view of the embodiment shown in FIG. 12 in partial section. It can be seen that multiple layers $8_1, 8_2, \ldots, 8_N$ of conductors 20 are wound on the outer surface 106 of the stator 102 of the electric machine 1.

These two implementation options possibilities, shown in FIGS. 9-12, facilitate filters 3 comprising a large surface and compact coil 10 for the filter 3 or the filter element 30. In addition, the filter 3 or the filter element 30 can be implemented with a larger capacity than is the case with the filters 3 or filter elements 30 of the embodiments of FIGS. 5 and 13-15. A further advantage of the embodiments of FIGS. 9 and 11 is that the filter elements 30 are thermally very well connected to the electric machine 1.

Figure 13:
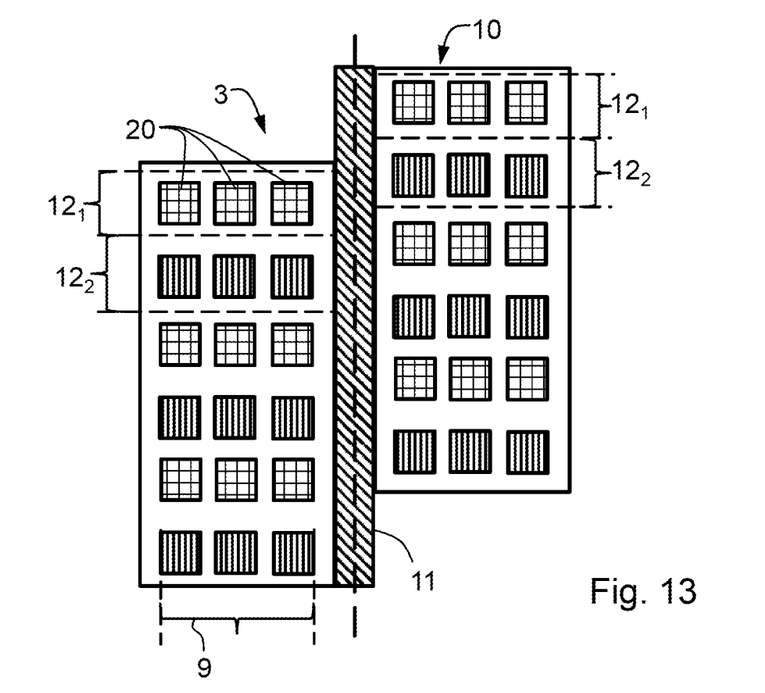
FIG. 13 shows the embodiment of a multi-layer winding for forming the coil of the filter.

FIG. 13 shows the embodiment of a multi-layer winding, which is constructed from multiple windings $12_1, 12_2, \ldots, 12_N$. Here, the coil 3 consists of a first winding $12_1$ and a second winding $12_2$.

Figure 14:
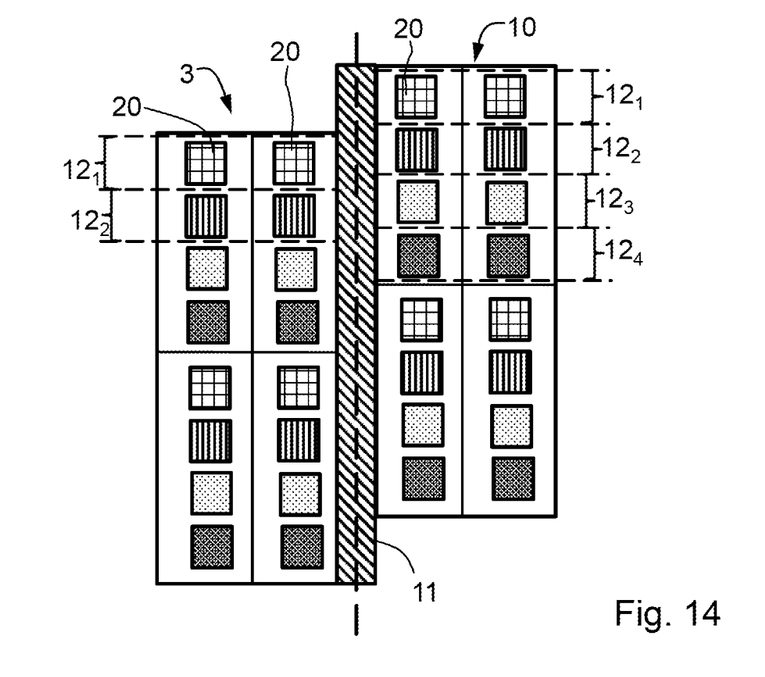
FIG. 14 shows the embodiment of a multi-layer winding for forming the coil of the filter, wherein multiple windings are connected in parallel.

FIG. 14 shows the embodiment of a multi-layer winding, which according to the embodiment described here consists of a first winding $12_1$, a second winding $12_2$, a third winding $12_3$ and a fourth winding $12_4$. For the formation of the coil 10 of the filter 3, the first winding $12_1$ and the second winding $12_2$ are connected in parallel. Likewise, the third winding $12_3$ and the fourth winding $12_4$ are connected in parallel. The embodiment described in FIG. 14 with the first winding $12_1$, the second winding $12_2$, the third winding $12_3$ and the fourth winding $12_4$, is only used for description. More than four windings $12_1, 12_2, \ldots, 12_N$ are also possible. The windings $12_1, 12_2, \ldots, 12_N$ can either be connected in parallel, which requires an even multiple, or can be controlled in a phase-shifted mariner, such as 5-phase then 72 degrees out-of-phase or 12-phase, then 30 degrees out-of-phase, etc.

Figure 15:
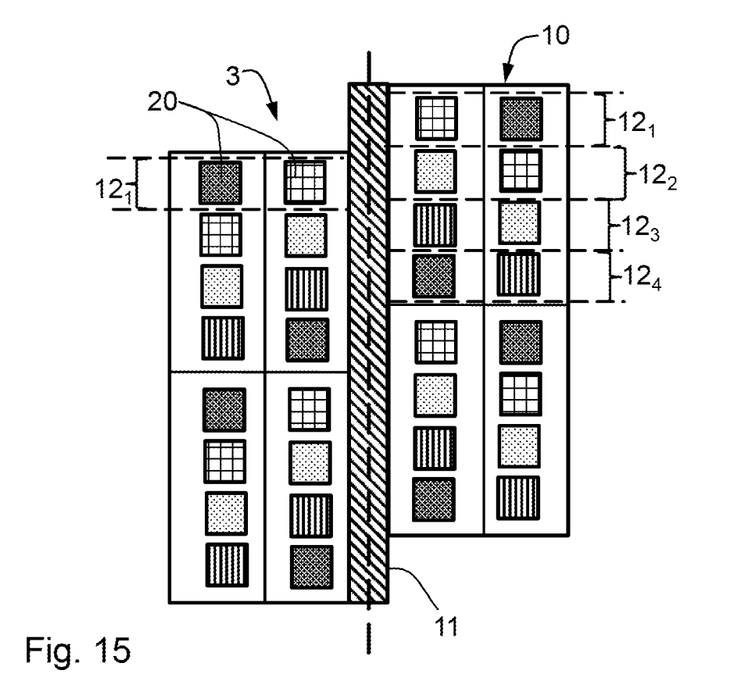
FIG. 15 shows the further embodiment of a multi-layer winding for forming the coil of the filter, wherein multiple windings are connected in parallel but wound in an offset manner.

FIG. 15 shows a further embodiment of a multi-layer winding which, according to the embodiment described here, consists of a first winding $12_1$, a second winding $12_2$, a third winding $12_3$ and a fourth winding $12_4$. For the formation of the coil 10 of the filter 3, the first winding $12_1$ and the third winding $12_3$ are connected in parallel. Likewise, the second winding $12_2$ and the fourth winding $12_4$ are connected in parallel. According to this embodiment, the first winding $12_1$ and the third winding $12_3$ (half-bridge) and the second winding $12_2$ and the fourth winding $12_4$ (half-bridge) are connected in parallel and are energized 180° out-of-phase.

According to a further embodiment, four phases are each supplied with current phase-shifted by 90° (in each case via a half-bridge) and the first winding $12_1$ and the third winding $12_3$ are shifted by 180° with respect to one another.

As can be seen from FIGS. 13-15, multiple large-surface, thin and wide conductors 20 are provided for the formation of the coil 10 of the filter 3 in one of the multiple windings $12_1, 12_2, \ldots, 12_N$ of the coil 10 can be connected according to the above-mentioned embodiments. As already described in FIG. 5, the ratio between the width B and the height H of the D conductor 20 is that the width B is greater than the height H (thickness) of the conductor 20. Consequently, flat conductors 20 are used for winding the coil 10. According to the disclosure, the capacitor formed as a result is relevant for the function of the filter 3 or filter element 30.

It should be mentioned at this point that the number of windings $12_1, 12_2, \ldots, 12_N$ mentioned in the above description is for descriptive purposes only and should not be construed as a limitation of the disclosure.

It is believed that the present disclosure and many of the advantages noted therein will be understandable from the preceding description. It will be apparent that various changes in the shape, construction and arrangement of the components can be made without departing from the disclosed subject matter. The form described is illustrative only and it is the intent of the appended claims to comprise and incorporate such changes. Accordingly, the scope of the disclosure should be limited only by the appended claims.

LIST OF REFERENCE SYMBOLS

1 Electric machine
2 Power electronics
3 Filter
4 Cable
5 Inductor
6 Capacitor
$8_1, 8_2, \ldots 8_N$ Layer
9 Turn
10 Coil
10E End
11 Core
$12_1, 12_2, \ldots 12_N$ Winding
13 Insulation material
20 Conductor
30 Filter element
32 Stator ring
34 Interior
101 Rotor
102 Stator
103 Winding heads
104 End face
106 Lateral surface
A Axis
A-A Section line
B Width
F Surface
H Height

The invention claimed is:

1. A filter for an electric machine, the filter comprising an inductor, which is a coil, and a capacitor,
wherein:
the coil has multiple windings and turns of the windings comprise at least one conductor which is designed to be flat and the coil itself forms the capacitor of the filter, wherein a surface of one conductor is located opposite the surface of an adjacent conductor; and
the turns of the windings for the coil of the filter are wound around a core and the conductor of each winding is separated from other conductors by an insulation material.

2. The filter according to claim 1, wherein the coil comprises a first winding and a second winding, and the turns of the first winding and of the second winding comprise a single conductor.

3. The filter according to claim 1, wherein the coil comprises a first winding and a second winding, and the turns of the first winding and of the second winding comprise multiple separate conductors which together form the surface in each turn.

4. The filter according to claim 1, wherein the coil comprises a first winding, a second winding, a third winding, and a fourth winding, which each comprises multiple separate conductors, which together form the surface in each turn.

5. The filter according to claim 1, wherein the coil comprises flat and wide conductors on an end face of a stator of the electric machine in multiple layers or comprises flat and wide conductors which are wound onto a lateral surface of the stator of the electric machine in multiple layers.

6. A filter element for an electric machine, comprising at least one filter having an inductor, which is a coil, and a capacitor, wherein the coil has multiple windings and turns of the windings comprise at least one conductor which is designed to be flat and the coil itself forms the capacitor of the filter, wherein a surface of one conductor is located opposite the surface of an adjacent conductor, wherein the turns of the windings are wound around a core and the conductor of each winding is separated from other conductors by an insulation material,
wherein the filter is attached to a stator ring via the core in such a way that the filter is oriented towards an interior of the stator ring or that the filter is inserted into the stator ring and is aligned in a direction of an axis of the stator ring.

7. The filter element according to claim 6, wherein the stator ring defines the interior in which a power electronics is installed.

8. The filter element according to claim 6, wherein the stator ring is mounted together with the at least one filter on the stator of the electric machine.

9. A filter element for an electric machine comprising at least one filter including an inductor, which is a coil, and a capacitor, wherein the coil has multiple windings and turns of the windings comprise at least one conductor which is designed to be flat and the coil itself forms the capacitor of the filter, wherein a surface of one conductor is located opposite the surface of an adjacent conductor, wherein the coil comprises flat and wide conductors on an end face of a stator of the electric machine in multiple layers or comprises flat and wide conductors which are wound onto a lateral surface of the stator of the electric machine in multiple layers, wherein the at least one filter and the stator of the electric machine form the filter element.

* * * * *